US 6,535,060 B2

(12) United States Patent
Goren et al.

(10) Patent No.: US 6,535,060 B2
(45) Date of Patent: Mar. 18, 2003

(54) SYSTEM AND METHOD FOR NOISE AND SPURIOUS SUPRESSION IN POWER AMPLIFIER SYSTEMS

(75) Inventors: Yehuda G. Goren, Palo Alto, CA (US); Charles E. Jensen, Carmichael, CA (US); Donald R. Gagne, Placerville, CA (US); Philip M. Lally, Palo Alto, CA (US); David Zavadil, Cameron Park, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 63 days.

(21) Appl. No.: 09/730,084

(22) Filed: Dec. 5, 2000

(65) Prior Publication Data

US 2002/0075071 A1 Jun. 20, 2002

(51) Int. Cl.[7] ................................................. H03F 3/18
(52) U.S. Cl. ........................ 330/107; 330/147; 348/608
(58) Field of Search ................................. 330/107, 149; 348/608

(56) References Cited

U.S. PATENT DOCUMENTS

| 4,134,114 A | 1/1979 | Riggs et al. |
| 4,197,540 A | 4/1980 | Riggs et al. |
| 4,600,892 A | 7/1986 | Wagner et al. |
| 5,608,331 A | 3/1997 | Newberg et al. |
| 6,400,415 B1 * | 6/2002 | Danielsons ................. 348/608 |

* cited by examiner

Primary Examiner—Michael B Shingleton
(74) Attorney, Agent, or Firm—Kirkpatrick & Lockhart LLP

(57) ABSTRACT

An amplifier system including a vacuum tube amplifier having an input signal terminal and an output signal terminal, wherein the vacuum tube amplifier is for amplifying an input signal supplied to the input signal terminal, a phase comparator having a first input terminal responsive to the input signal and having a second input terminal coupled to the output signal terminal of the vacuum tube amplifier, and a phase shifter having a first input terminal responsive to the input signal, a second input terminal coupled to an output terminal of the phase comparator, and an output terminal coupled to the input signal terminal of the vacuum tube amplifier.

31 Claims, 11 Drawing Sheets

SYSTEM AND METHOD FOR NOISE AND SPURIOUS SUPRESSION IN POWER AMPLIFIER SYSTEMS

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF INVENTION

1. Field of Invention

The present invention relates generally to power amplifiers and, more particularly, to circuits and methods for suppression of noise and spurious signals in power amplifier systems.

2. Description of the Background

In wireless communications systems, the reception quality of the received signal is related to the signal to noise ratio (SNR), i.e., the ratio of the signal strength to the noise level, at the receiver. Typically, the amount of noise introduced by the power amplifier at the transmitter is negligible compared to the thermal noise at the receiver. This is especially true for long-range applications, such as on the order of hundreds of miles or more. Consequently, it is ordinarily not necessary to utilize noise suppression techniques at the transmitter. Rather, to improve the SNR, it is often sufficient to merely increase signal power at the transmitter.

However, for short-range applications, the amount of noise introduced at the transmitter becomes increasingly important. This is because the noise introduced by the transmitter may approach, or even exceed, the thermal noise floor at the receiver. Moreover, for narrow-band applications, such as with radar systems, the SNR cannot be improved merely by increasing the signal power from the transmitter because of the non-linearity of the power amplifier at saturation, which may cause intolerable spectral regrowth (mostly in pulse modulated radar systems). Moreover, because noise is random, pre-distortion techniques cannot be used.

Accordingly, there exists a need for a manner to suppress noise and other spurious signals in a power amplifier. There further exists a need for a manner to inexpensively suppress noise and other spurious signals in a cascaded amplifier system.

BRIEF SUMMARY OF INVENTION

The present invention is directed to an amplifier system. According to one embodiment, the amplifier system includes a vacuum tube amplifier having an input signal terminal and an output signal terminal, wherein the vacuum tube amplifier is for amplifying an input signal supplied to the input signal terminal, a phase comparator having a first input terminal responsive to the input signal and having a second input terminal coupled to the output signal terminal of the vacuum tube amplifier, and a phase shifter having a first input terminal responsive to the input signal, a second input terminal coupled to an output terminal of the phase comparator, and an output terminal coupled to the input signal terminal of the vacuum tube amplifier.

In contrast to prior techniques, the present invention provides an efficient and inexpensive technique for suppressing noise and other spurious signals for vacuum tube amplifiers. Moreover, the techniques of the present invention are applicable for amplifier systems having two or more cascaded amplifiers. In addition, the noise suppression technique of the present invention does not require modification of the vacuum tube amplifier to accommodate serrodyne modulation of the interaction region of the vacuum tube amplifier, such as the helix of a traveling wave tube (TWT). These and other benefits of the present invention will be apparent from the detailed description of the invention hereinbelow.

DESCRIPTION OF THE FIGURES

For the present invention to be clearly understood and readily practiced, the present invention will be described in conjunction with the following figures, wherein.

DETAILED DESCRIPTION OF THE INVENTION

Figure 1:
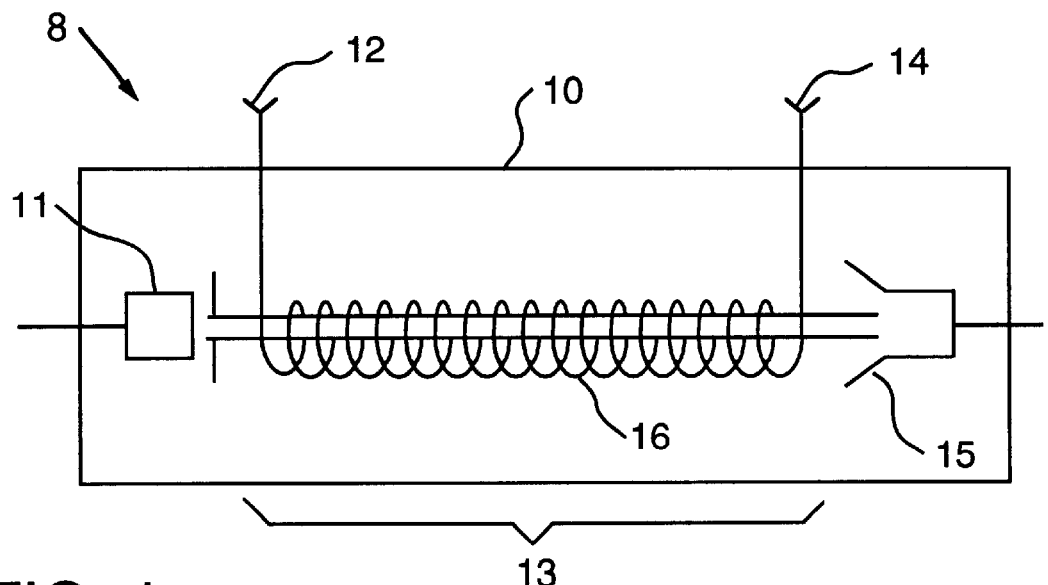
FIG. 1 is a schematic diagram of one type of a vacuum tube amplification device.

FIG. 1 is a schematic diagram of one type of a vacuum tube device 8 including an evacuated tube 10, a source of electrons 11, an input signal terminal 12 for introducing an input signal, an interaction region 13 where electrons interact with the input signal, and an output signal terminal 14 where an amplified signal emerges from the tube 8. The vacuum tube device 8 may be, for example, a traveling wave tube (TWT), as illustrated in FIG. 1. A TWT typically includes a focusing magnet (not shown) to focus the beam of electrons through the interaction region 13, a collector 15 to collect the electron beam after the output microwave power has been generated, and an internal attenuator (not shown) to absorb microwave power reflected back into the tube from mismatches in the output. Although the present invention will be described in the context of a TWT, benefits of the present invention may be realized with other vacuum tube devices such as, for example, klystrons and triodes.

The source of electrons 11 may be, for example, an electron gun. An electron gun is a particular kind of electron source that generates, accelerates, and focuses an electron beam so that the beam follows a desired trajectory after it leaves the electron gun. An electron gun is discussed in more detail hereinbelow with respect to FIG. 2.

The input signal terminal 12 receives an input signal to be amplified by the tube device 8, which is typically an amplitude modulated carrier signal. The carrier signal may be, for example, in the microwave frequency range. The carrier signal may be modulated by a data signal, such as a voice data signal having a frequency, for example, in the kHz range, or a video data signal having a frequency, for example, in the MHz range. The carrier signal may also be modulated by other types of data signals. In any event, the frequency of the data signal modulating the carrier signal may be significantly less than the frequency of the carrier signal.

The interactive region 13 is a portion of the tube 8 where the input signal is amplified through interaction with an electron beam. The interaction region 13 may include, for example, a conductive helix 16, as illustrated in FIG. 1, for broadband applications or a coupled-cavity region (not shown) for high power applications. In the case of a conductive helix 16, for example, the electron beam may pass through the helix 16 while the signal to be amplified is conducted on the helix 16, and inductive interactions occur between the signal and the electrons. The signal modulates the electron beam, and the modulated electron beam amplifies the signal. Typically, it is desirable for the signal to be amplified and the electrons to move along the interaction region at the same speed. Noise generated by the tube device 8, however, may introduce a speed deviation between the signal and the electrons.

The output signal terminal 14 is the pathway by which the signal leaves the tube device 8. The signal on the output signal terminal 14 is an amplified version of the input signal that entered the tube device 8 at the input signal terminal 12.

Figure 2:
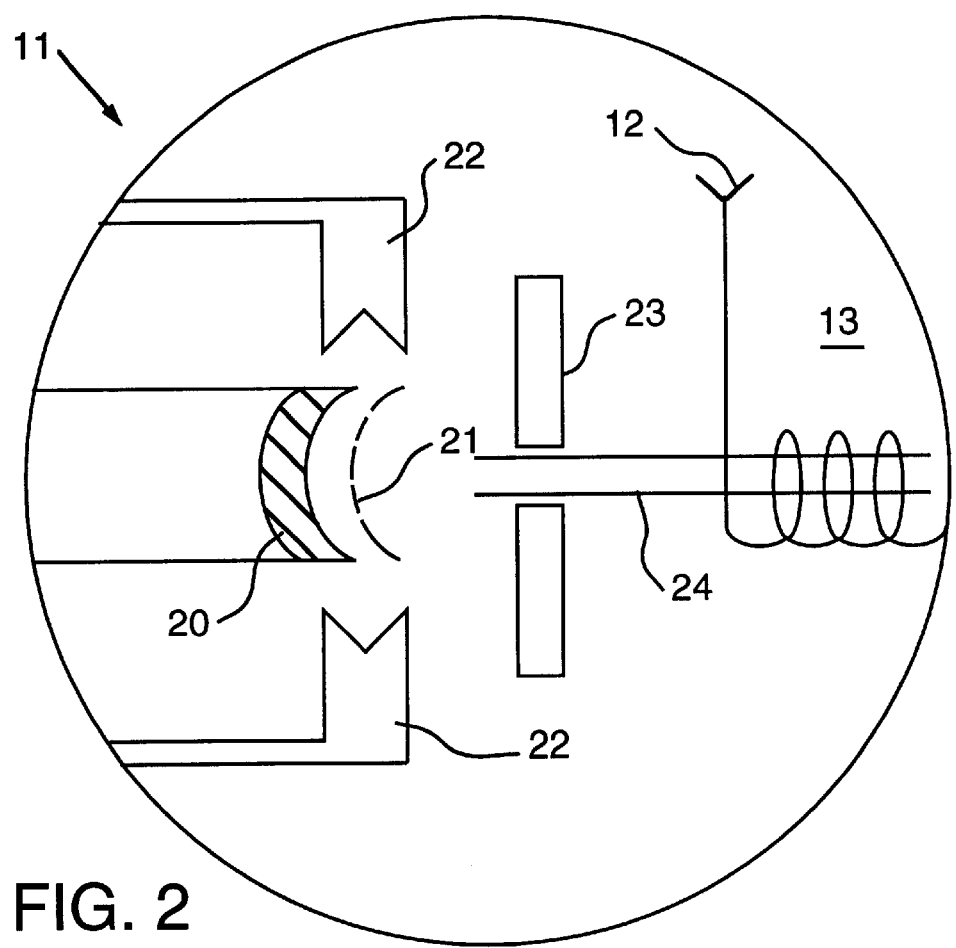
FIG. 2 is a schematic diagram of a source of electrons of the vacuum tube device of FIG. 1.

FIG. 2 is a schematic diagram of a source of electrons 11 in the form of an electron gun according to one embodiment of the present invention. In that embodiment, the source of electrons 11 includes a thermionic cathode 20, one or more grids 21 for inducing emission of electrons, focusing electrodes 22 for focusing the electrons into a beam, and an apertured anode 23 for further directing the electron beam 24 into the interaction region 13. The source of electrons 11 produces an electron beam 24. For TWT applications, a long, thin electron beam 24 at a relatively low voltage and high current density is typically desirable. Electron guns have many embodiments and variations, such as a planar cathode faced by a planar anode to more elaborate designs such as Pierce guns, conical diode electrodes, concentric cylinders, and spherical cap cathodes. According to the present invention, the electron source 11 may be, for example, any type of suitable electron gun.

The cathode 20 introduces the electrons into the tube 10. The cathode 20 is typically at a lower voltage relative to the grid(s) 21, the anode 23, and the helix 16. This may be realized, for example, by applying a negative voltage to the cathode 20 such as, for example, −10 kV, and grounding the anode 23 and the helix 16. The voltage potential difference between the cathode 20 and the grid(s) 21 typically is on the order of 100 V.

The voltage potential difference between the cathode 20 and the anode 23 affects the kinetic energy of the electrons emitted by the cathode 20: the greater the voltage potential difference the greater the kinetic energy of the emitted electrons, and the lesser the voltage potential the lesser the kinetic energy of the electrons. The kinetic energy of the emitted electrons may also be increased by providing a voltage potential difference between the cathode 20 and the interaction region 13 of the tube device 8, such as by modulating the voltage potential difference between the cathode 20 and the helix 16 according to, for example, the serrodyne modulation technique. The number of electrons emitted by the cathode 20, which is proportional to the current of the electron beam 24, is related to the voltage potential difference between the cathode 20 and, for example, the focusing electrodes 22 or the grid(s) 21.

Figure 3:
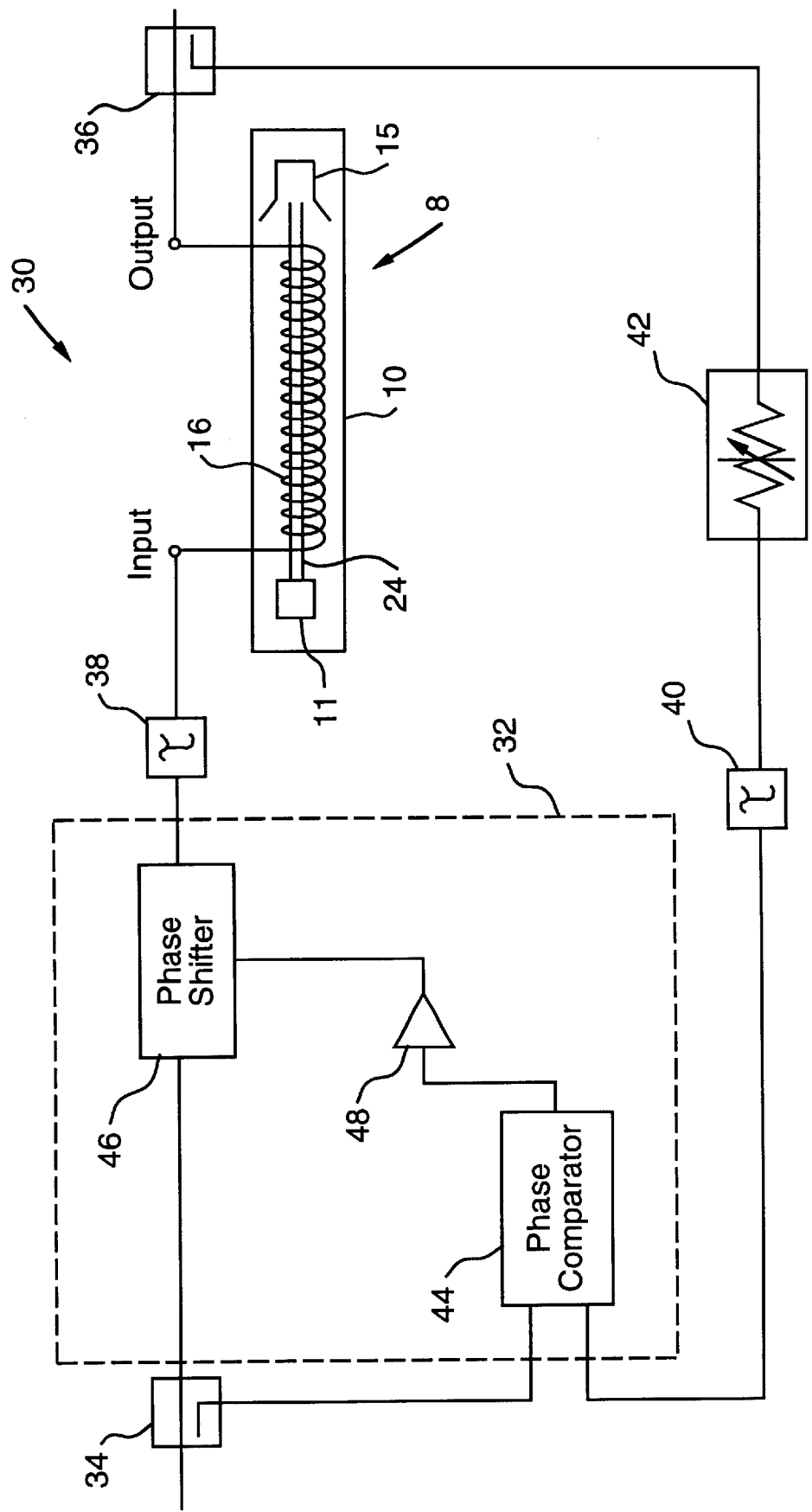
FIGS. 3–12 are combination block/schematic diagrams of an amplifier system according to embodiments of the present invention.

FIG. 3 is a block diagram of an amplifier system 30 according to one embodiment of the present invention. The amplifier system 30 includes the vacuum tube device 8, such as described hereinbefore with respect to FIGS. 1 and 2, arid a phasenoise suppression circuit 32. As illustrated in FIG. 3, the phase noise suppression circuit 32 may have input terminals coupled to both the input and the output of the tube device 8. A directional coupler 34 may be used to provide a portion of the input signal to the phase noise suppression circuit 32, and a directional coupler 36 may be used to provide a portion of the output signal to the phase noise suppression circuit 32. Also as illustrated in FIG. 3, the amplifier system 30 may include a delay line 38 coupled between the input terminal 12 of the tube device 8 and the coupler 34. The purpose of the delay line 38 may be to delay the input signal to compensate for a time delay caused by the phase noise suppression circuit 32. In addition, the amplifier system 30 may include a delay line 40 and an attenuator 42 coupled between the coupler 36 and the input to the phase noise suppression circuit 32. The delay line 40 and the attenuator 42 may harmonize the power and delay of the output signal to correspond to that of the input signal. As such, the attenuation provided by the coupler 36 and the attenuator 42 may match the gain of the tube device 8.

The phase noise suppression circuit 32 may provide compensation for the phase noise introduced by the tube device 8. According to one embodiment, as illustrated in FIG. 3, the phase noise suppression circuit 32 may include a phase comparator 44 and a phase shifter 46. The phase comparator 44 includes an input terminal coupled to each of the input signal and the output signal of the tube device 8, and outputs a signal, such as a DC voltage signal, indicative of the phase difference between the two signals. The phase comparator 44 may be embodied, for example, as a hybrid circuit including, for example, a fast-step recovery diode, two coupling capacitors and a matched Schottky diode pair.

The phase shifter 46 receives the output signal from the phase comparator 44 and phase shifts the input signal supplied to the tube device 8 to compensate for the phase noise introduced by the tube device 8. According to one embodiment, the phase shifter 46 may phase shift the input signal supplied to the input signal terminal 12 of the vacuum tube device by one-hundred eighty degrees plus the phase difference detected by the phase comparator 44. Thus, for example, if the phase comparator 44 outputs a signal to the phase shifter 46 that the phase difference between the input and output signals of the tube device is one degree, the phase shifter 46 may phase shift the input signal 181 degrees (or −1 degree) to compensate for the phase noise. An amplifier 48 may be provided between the phase comparator 44 and the phase shifter 46 to amplify the output signal from the phase comparator 44 if necessary. The amplifier 48 may be, for example, a low noise solid-state amplifier. The phase shifter 46 may be embodied as, for example, a wideband microwave phase shifter, a voltage-controlled phase shifter, an analog phase shifter, a mechanical phase shifter, or a digital phase shifter.

The phase noise suppression circuit 32 described in conjunction with FIG. 3 provides an efficient technique for compensating for the phase noise introduced by the tube device 8 without requiring modification of the tube device 8 to support, for example, serrodyne modulation of the interaction region 13.

Figure 4:
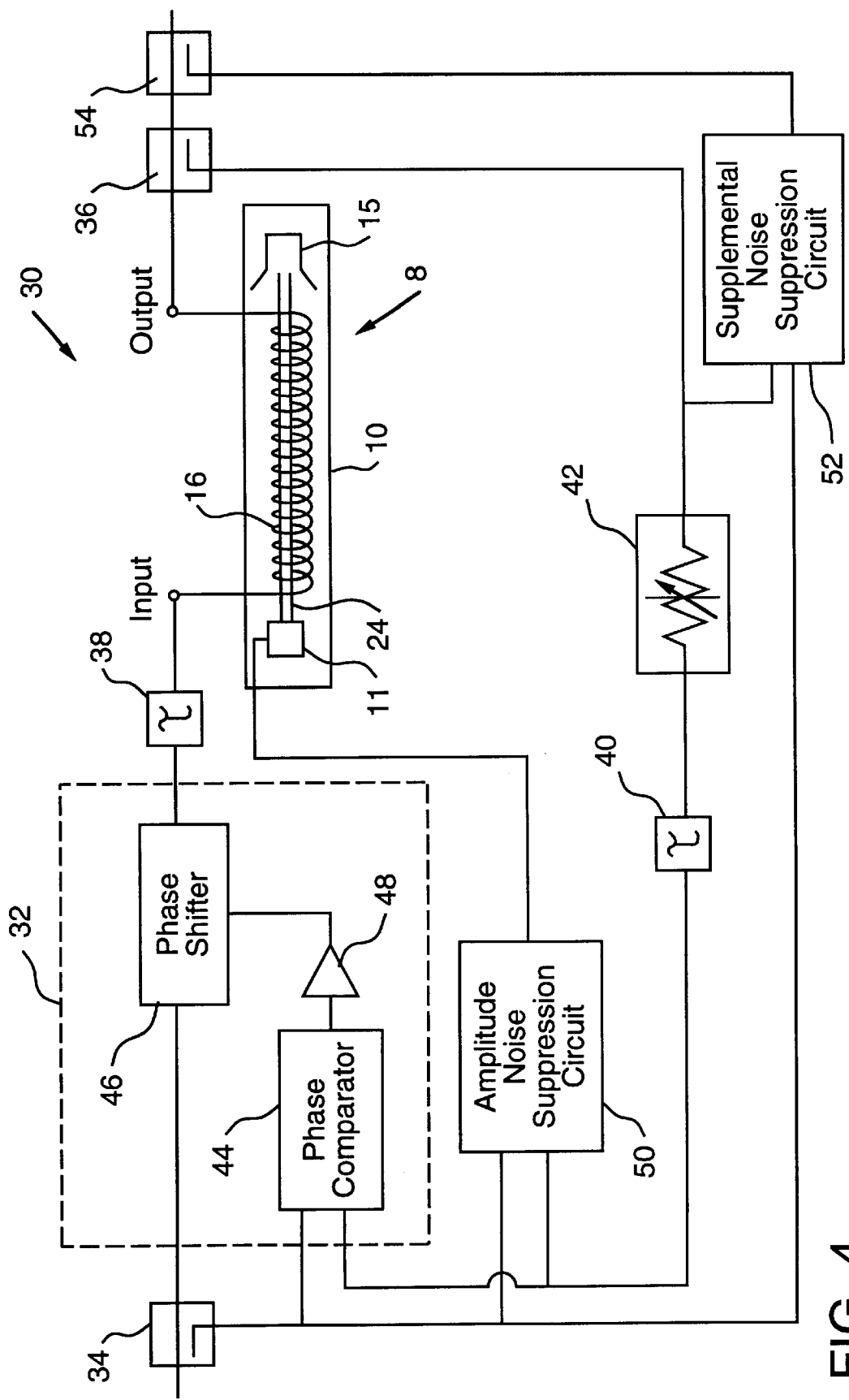

FIG. 4 is a diagram of the system 30 according to another embodiment. The system 30 illustrated in FIG. 4 is similar to that of FIG. 3, except that it additionally includes an amplitude noise suppression circuit 50 and a supplemental noise suppression circuit 52. Each of the amplitude noise suppression circuit 50 and the supplemental noise suppression circuit 52 may have input terminals coupled to both the input and the output of the tube device 8. In addition, as described further hereinbelow, the supplemental noise suppression circuit 52 may have an output terminal coupled to the output of the tube device 8 via a directional coupler 54. According to such an embodiment, the supplemental noise suppression circuit 52 may operate according to a feedforward noise suppression technique. According to another embodiment, as described further hereinbelow, the supplemental noise suppression circuit 52 may operate according to a feedback noise suppression technique.

The amplitude noise suppression circuit 50 may provide compensation for the amplitude noise introduced by the tube device 8. To compensate for the amplitude noise introduced by the tube device 8, the amplitude noise suppression circuit 50 may control the number of electrons emitted by the electron source 11 of the tube device 8. According to one embodiment, as discussed further hereinbelow, the output terminal of the amplitude noise suppression circuit 50 is coupled to the electron source 11, and controls the current of the electron beam 24 emitted from the electron source 11 by controlling the voltage applied to the focusing electrodes 22 relative to the cathode 20. According to another embodiment, the amplitude noise suppression circuit 50 may control the voltage applied to the grid(s) 21 relative to the cathode 20. Embodiments of the amplitude noise suppression circuit 32 will be described further hereinbelow in conjunction with FIGS. 7 and 8.

The supplemental noise suppression circuit 52 provides additional noise compensation for the tube device 8 by, for example, canceling the noise components introduced by the tube device 8 when amplifying the input signal at either the input or the output of the tube device 8. As discussed hereinbelow with respect to FIGS. 9–11, the supplemental noise suppression circuit 52 may provide additional noise compensation according to, for example, a feedforward technique or a feedback technique.

Figure 5:
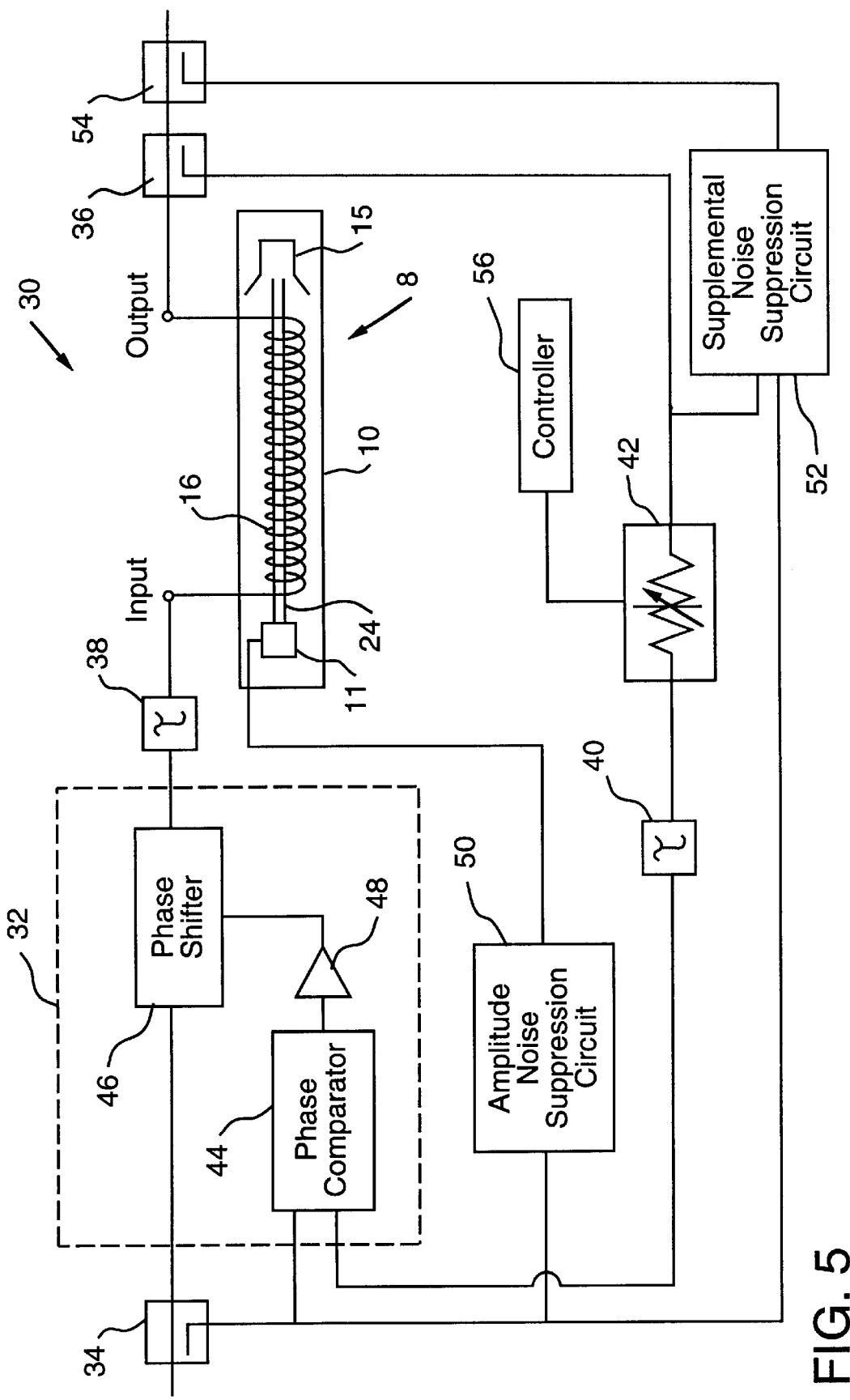
Figure 6:
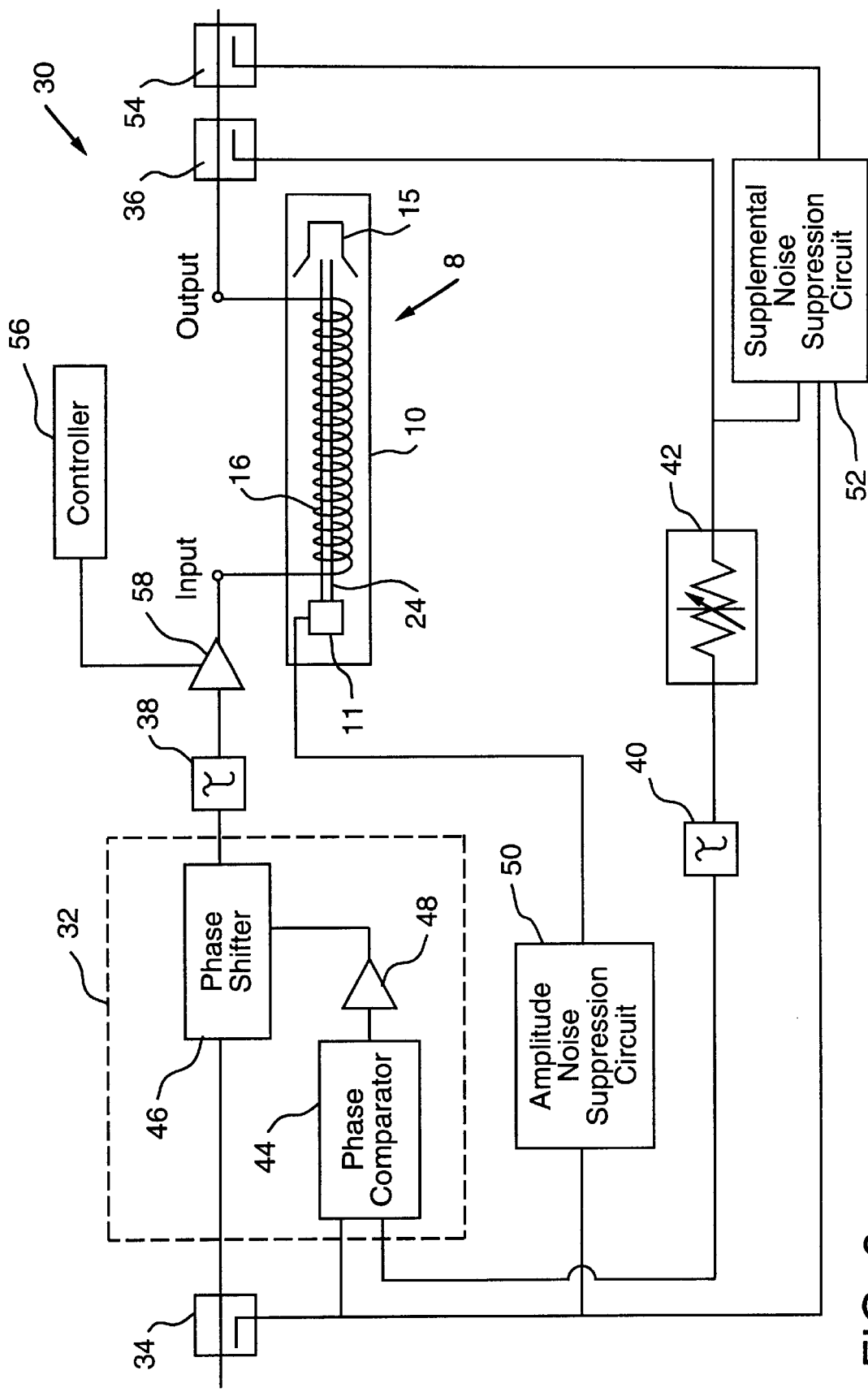

FIGS. 5 and 6 are diagrams of the amplifier system 30 according to other embodiments. In FIG. 5, the attenuation provided by the attenuator 42 may be adaptively varied to correspond to the gain provided by the tube device 8 so that the input and output signals are harmonized with respect to signal strength. According to such an embodiment, the attenuation provided by the attenuator 42 and the coupler 36 should match the gain of the tube device 8. The input and output signals of the tube device 8 may be sampled by a controller 56 to determine the gain of the tube device 8. The controller 56 may output a signal to the attenuator 42 to adaptively adjust the attenuation provided by the attenuator 42 to compensate for any variance in the gain provided by the tube device 8.

According to another embodiment, as illustrated in FIG. 6, the attenuator 42 is a fixed attenuator, and a pre-amplifier 58 is provided at the input of the tube device 8. The gain provided by the pre-amplifier 58 may be adjusted so that the attenuation provided by the attenuator 42 and the coupler 36 matches the gain provided by the tube device 8 and the pre-amplifier 58. According to such an embodiment, the input and output signals of the tube device 8 may be sampled by the controller 56 to determine the gain of the tube device 8. The controller 56 may output a signal to the pre-amplifier 58 to adaptively adjust the gain provided by the pre-amplifier 58 to compensate for any variance in the gain provided by the tube device 8. The pre-amplifier 58 may be, for example, a solid-state. amplifier. Accordingly, where, for example, the gain provided by the tube device 8 drops by 2 dB, the gain of the pre-amplifier 58 may be adjusted to provide 2 dB of gain such that the signals input to the phase noise suppression circuit 32 and the amplitude noise suppression circuit 50 are of substantially the same signal strength.

Figure 7:
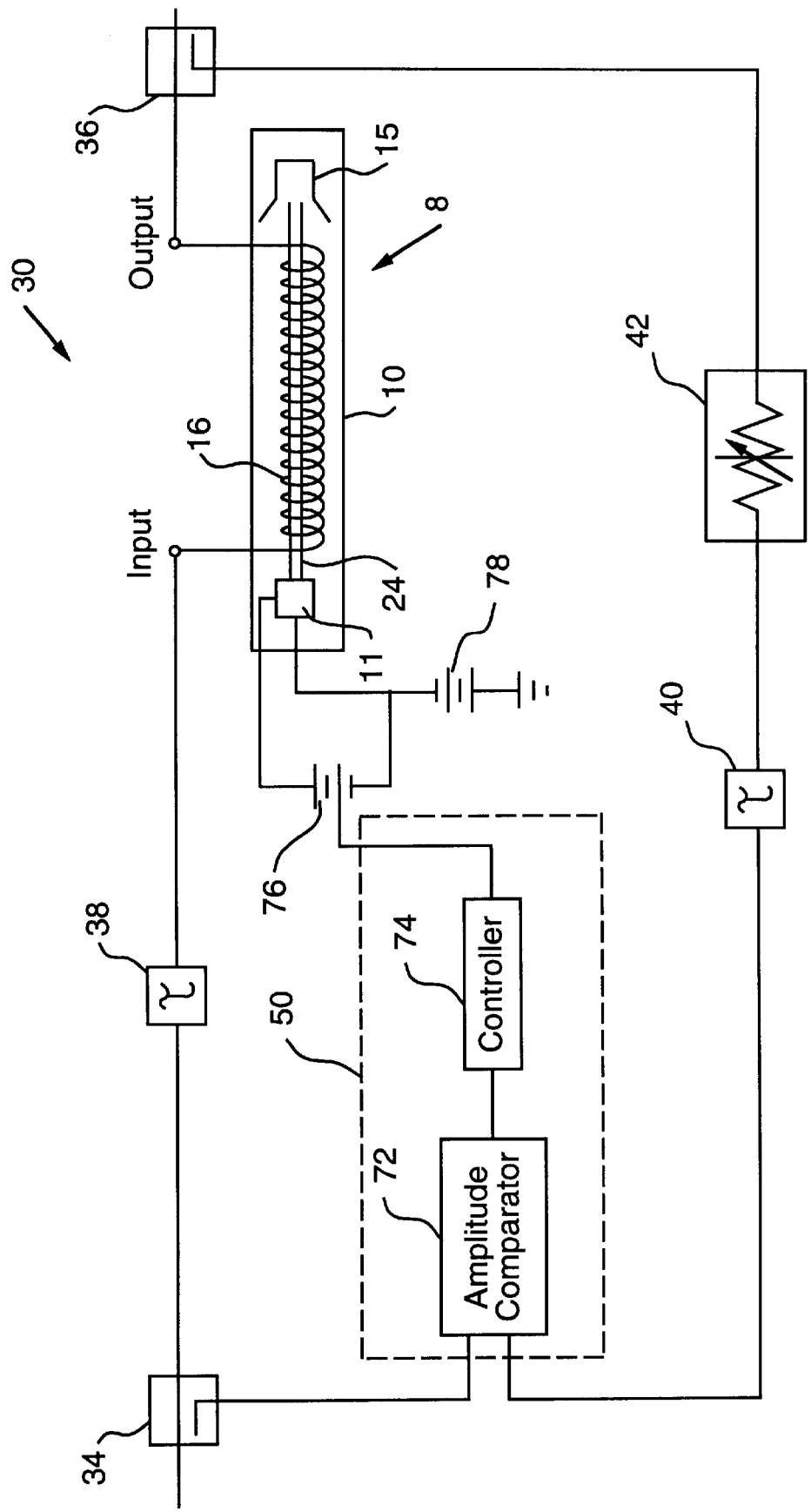
Figure 8:
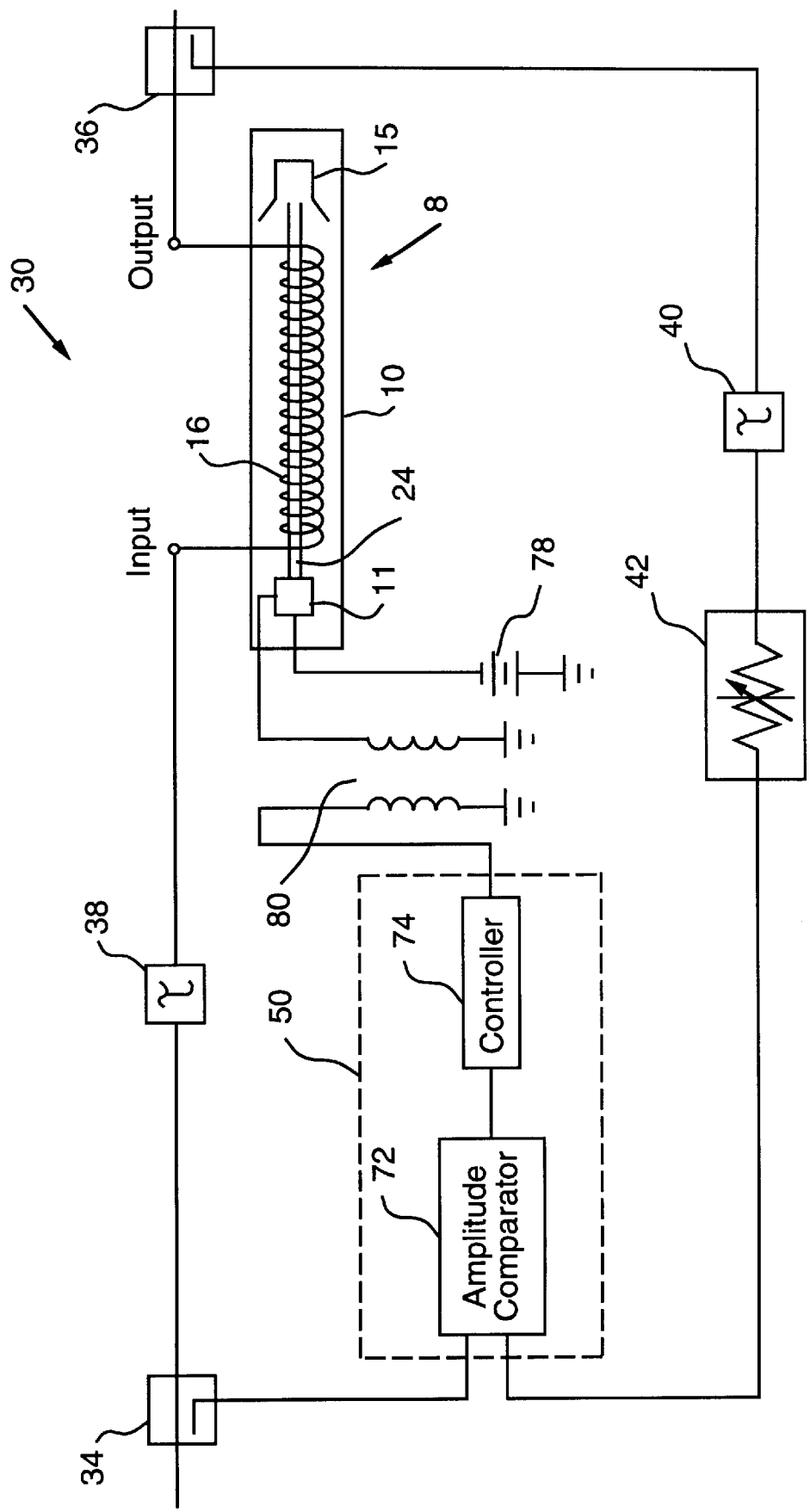

FIGS. 7 and 8 are diagrams of the amplifier system 30 showing different embodiments for the amplitude noise suppression circuit 50. For purposes of clarity, the phase noise suppression circuit 32 and the supplemental noise suppression circuit 52 are not shown in FIGS. 7 and 8.

For the embodiment illustrated in FIG. 7, the amplitude noise suppression circuit 50 includes an amplitude comparator 72 and a controller 74. The output of the amplitude noise suppression circuit 50 is coupled to a variable power source 76, which is coupled to the electron source 11 of the tube device 8. The amplitude comparator 72 has an input terminal coupled to each of the input and the output of the tube device 8, and outputs a signal such as, for example, a DC voltage signal, indicative of the amplitude difference between the two signals caused by the amplitude noise introduced by the tube device 8. Based on the input from the amplitude comparator 72, the controller 74 may output the appropriate control signal to the electron source 11, via the variable power source 76, to affect the current of the electron beam 24 generated by the electron source 11.

According to one embodiment, the controller 74 may be coupled to the focusing electrodes 22 of the electron source 11 to modulate the voltage of the focusing electrodes 22 relative to cathode 20 to control the current of the electron beam 24 to compensate for the amplitude noise introduced by the tube device 8. A power supply 78 may supply a voltage potential to the cathode 20, which may be negative relative to ground, as described hereinbefore. According to another embodiment, the output of the controller 74 may be coupled to the grid(s) 21. For such an embodiment, the control signal from the controller 74 may be a voltage signal that is applied to the grid(s) 21 to generate a voltage potential difference between the grid(s) 21 and the cathode 20 to dynamically compensate for the amplitude noise introduced by the tube device 8. The voltage of the signal applied to the grid(s) 21 may depend upon the distance between the grid(s) 21 and the cathode 20, and may be on the order of, for example, 10 V.

The controller 74 may be, for example, a digital device, such as a DSP or an ASIC, or an analog device, such as, for example, a low noise solid-state amplifier. For an embodiment in which the control signal output by the controller 74 is a voltage signal, the gain level of the controller 74 may depend upon the voltage of the output signal from the amplitude comparator 72 and the voltage required by either, for example, the focusing electrodes 22 or the grid(s) 21, to appropriately adjust the current of the electron beam 24. For example, if the signal output from the amplitude comparator 72 needs to be attenuated to apply the appropriate voltage to either the focusing electrodes 22 or the grid(s) 21, the controller 74 may have a negative gain (in terms of dB). Conversely, if the signal output from the amplitude comparator 72 needs to be amplified to apply the appropriate voltage to either the focusing electrodes 22 or the grid(s) 21, the controller 74 may have a positive gain.

FIG. 8 is a diagram of the amplifier system 30 according to another embodiment of the present invention. The amplifier system 30 illustrated in FIG. 8 is similar to that illustrated in FIG. 7, except that the amplitude noise suppression circuit 50 modulates either the focusing electrodes 22 or the grid(s) 21 of the electron source 11 to affect the current of the electron beam 24 emitted by the electron source 11, as described hereinbefore, via an isolated transformer 80. The transformer 80 may include a primary winding coupled to the amplitude noise suppression circuit 50 and a secondary winding coupled to the electron source 11. A voltage across the primary winding from the amplitude noise suppression circuit 50 may be magnetically coupled to the secondary winding in proportion to the turns ratio between the primary and secondary windings of the transformer 80.

Figure 9:
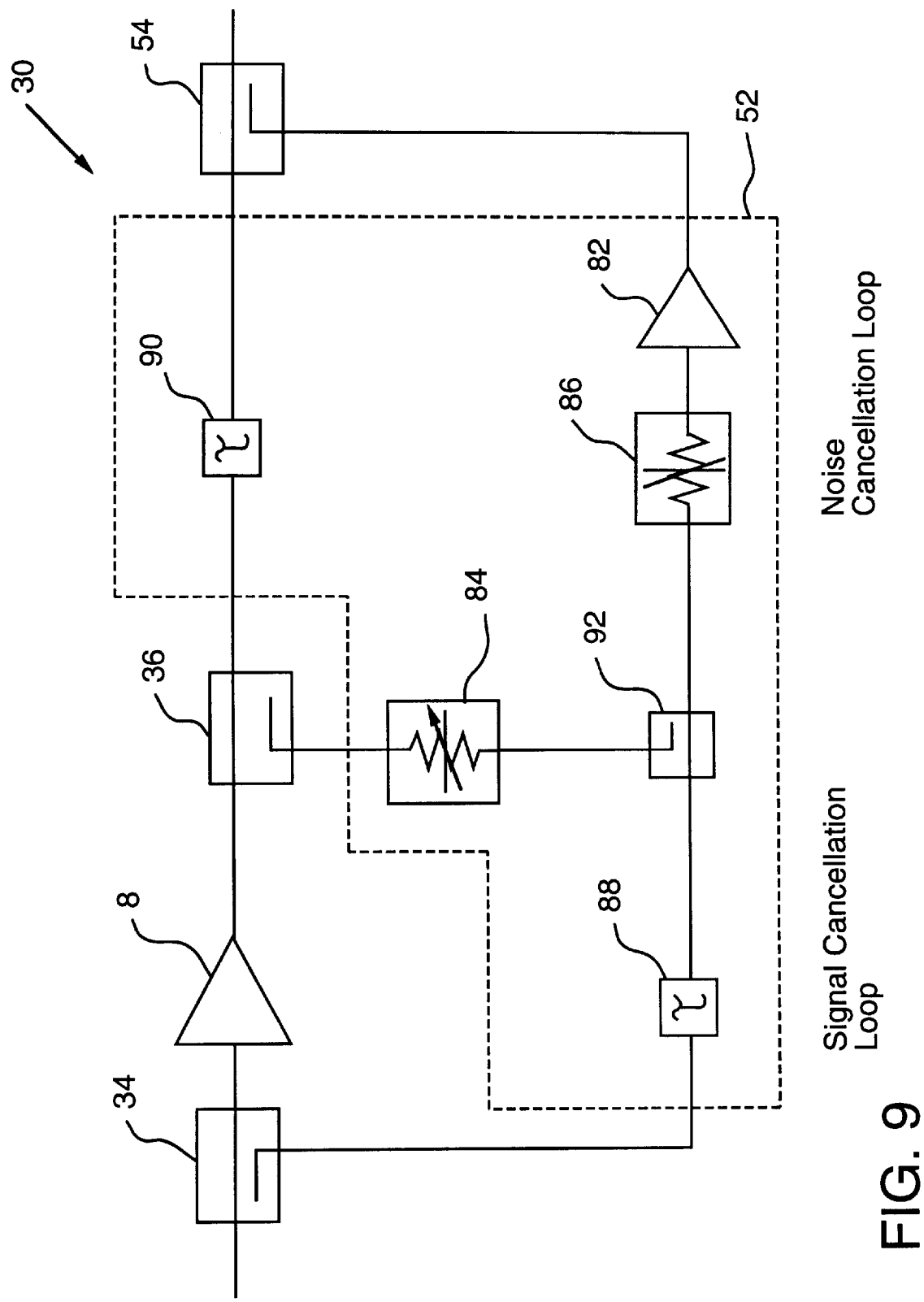
Figure 10:
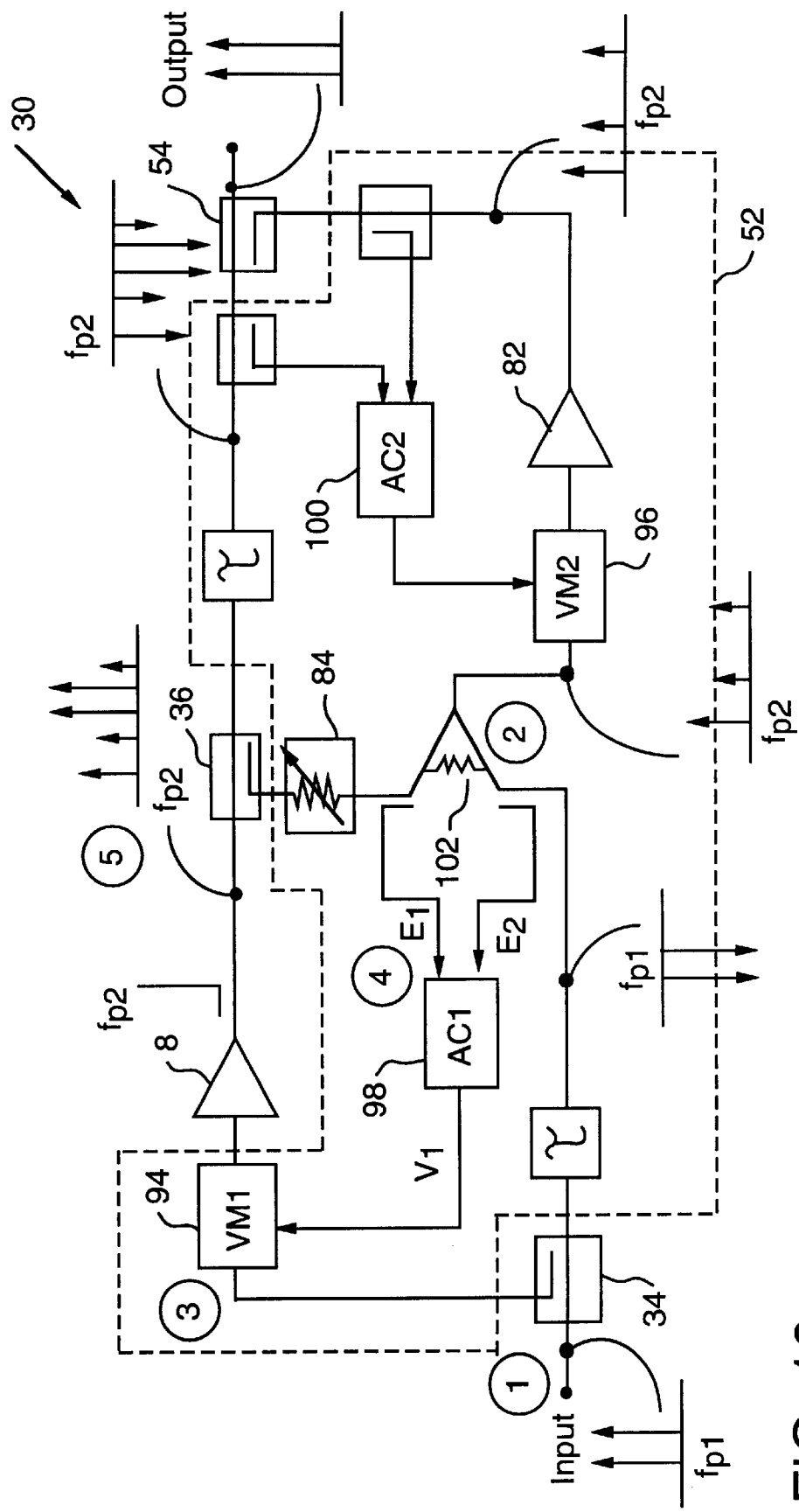
Figure 11:
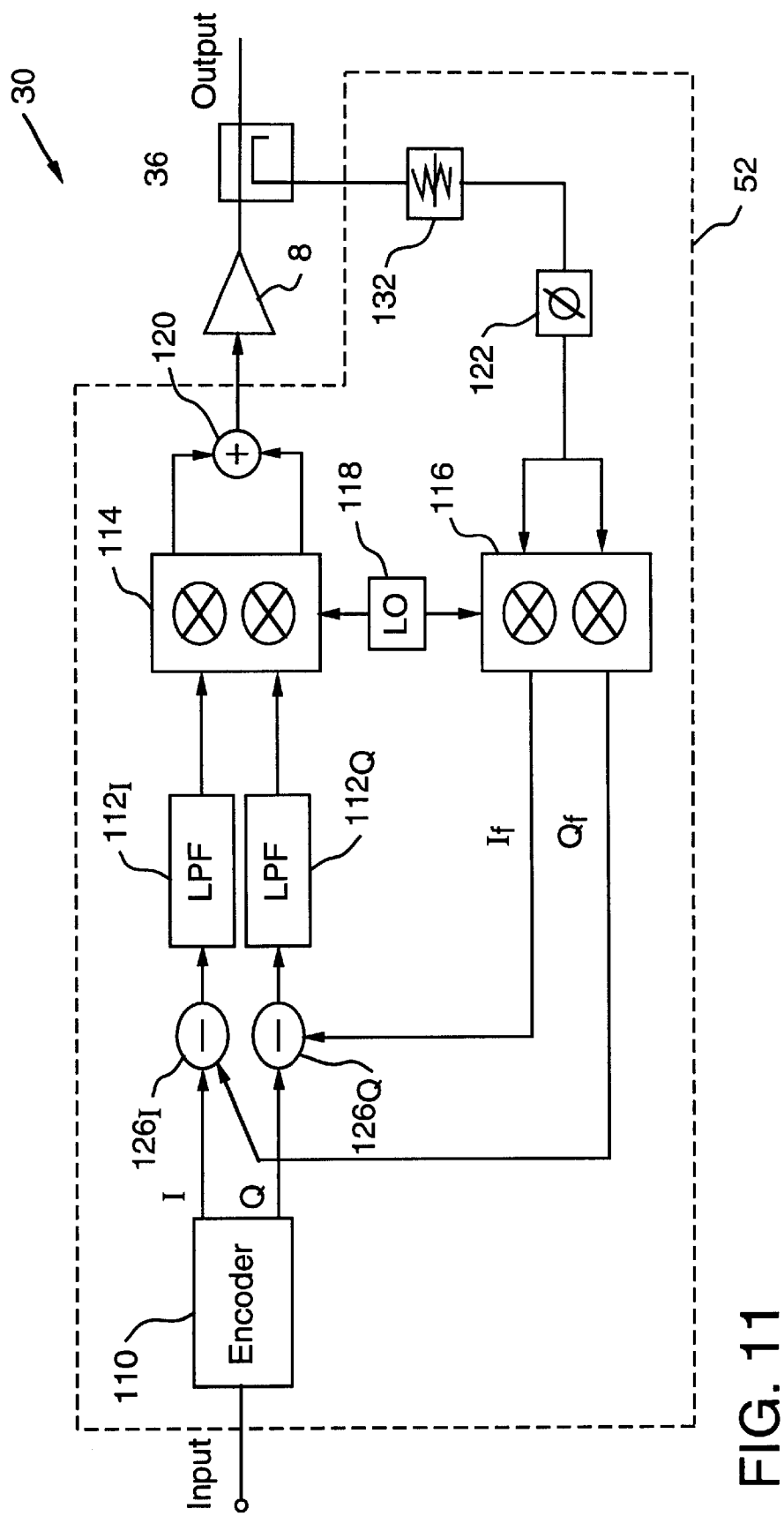

FIGS. 9–11 are diagrams of the amplifier system 30 illustrating different embodiments for the supplemental noise suppression circuit 52. For purposes of clarity, the phase noise suppression circuit 32 and the amplitude noise suppression circuit 50 are not shown in FIGS. 9 11. The tube device 8 is schematically shown in FIGS. 9–11 as an amplifier.

The supplemental noise suppression circuit 52 illustrated in FIG. 9 utilizes a non-adaptive feedforward technique, and includes an auxiliary amplifier 82 such as, for example, a low noise solid state amplifier, a pair of attenuators 84, 86, a pair of delay lines 88, 90 and a coupler 92. The feedforward noise suppression circuit 52 of FIG. 9 cancels noise introduced by the tube device 8 using two loops, the first being the signal cancellation loop and the second being the noise cancellation loop. The coupler 36 in the upper signal path. samples part of the output from the tube device 8 and adds the signal to the lower signal path after appropriate. attenuation by the attenuator 84. The delay line 88 may provide one hundred eighty degrees of phase difference with the upper signal path such that the signals add out of phase at the coupler 92. The resulting signal input to the attenuator 86 is thus only the noise distortion from the tube device 8.

In the second loop, the delay line 90 in the upper signal path may shift the signal one hundred eighty degrees out of phase with respect to the lower signal path. The attenuator 86 and the auxiliary amplifier 82 in the lower signal path may properly adjust the amplitude of the noise distortion components such that when the two signals are combined at the output coupler 54, the noise distortion components cancel.

FIG. 10 is a diagram illustrating the supplemental noise suppression circuit 52 according to another embodiment of the present invention. The supplemental noise suppression circuit 52 illustrated in FIG. 10 utilizes an adaptive feedforward technique to adaptively adjust for any variance in the performance of the tube device 8 or the auxiliary amplifier 82. The adaptive feedforward noise suppression circuit 52 includes a pair of vector modulators 94, 96, a pair of adaptive controllers 98, 100, and a Wilkinson combiner 102. The illustrated configuration uses pilot tones in the signal cancellation loop and a feedback path in each loop to monitor the cancellation junctions, such that variations in the gain of either amplifier (i.e., tube device 8 or auxiliary amplifier 82) may be adaptively accounted for. As seen at point 1, one of the main tones is used as the pilot tone, $f_{p1}$. This tone should be completely cancelled after the Wilkinson combiner 102 at point 2. The Wilkinson combiner 102 may be, for example, a 3 dB coupler fabricated on microstrip.

The first vector modulator (VM1) 94 at point 3 may adjust the signal level such that the $f_{p1}$ components at each input to the Wilkinson combiner 102 have the same magnitude for proper cancellation. To adaptively adjust the first vector modulator 94, the signals at the inputs to the Wilkinson combiner 102 ($E_1$ and $E_2$) at point 4 are sampled and fed to the first adaptive controller (AC1) 98. The first adaptive controller 98 downconverts the signals to a lower frequency, digitizes, and filters each signal to monitor the $f_{p1}$ components. Fast Fourier transforms are performed on both signal paths by the first adaptive controller 98 to determine an amplitude ratio, which is converted back to analog. The analog output $V_1$ is then used as the adjustment for the first vector modulator 94. The second adaptive controller 100 works in a similar fashion with respect to a second pilot tone, $f_{p2}$, used for the noise cancellation loop.

According to another embodiment of the present invention, the supplemental noise suppression circuit 52 may employ a feedback technique. FIG. 11 is a diagram of the amplifier system 30 according to one embodiment of the present invention including a feedback noise suppression circuit 52. The noise suppression circuit 52 illustrated in FIG. 11 utilizes a Cartesian feedback technique, although according to other embodiments, different types of feedback techniques may be used.

The Cartesian feedback noise suppression circuit 52 includes an encoder 110, a pair of low pass filters $112_I$–$112_Q$, a quad-modulator 114, and a quad-demodulator 116. Each of the quad-modulator 114 and the quad-demodulator 116 receive a mixing signal from a local oscillator 118. The input signal (i.e., the signal to be amplified by the tube device 8) is input to the encoder 110, which produces a pair of bit streams, I and Q, on separate channels. The I and Q channels are filtered respectively with the low pass filters $112_I$ and $112_Q$, and quad-modulated by the quad-modulator 114. A combiner 120 sums the quad-modulated bit streams, which are input to the tube device 8. An upconverter (not shown) may be provided after the quad-modulator 114 to upconvert the frequencies of the signals input to the tube device 8 if necessary.

The directional coupler 36 at the output of the tube device 8 feeds a portion of the output signal of the tube device 8 to a feedback path. The feedback signal is phase and amplitude adjusted, by a phase shifter 122 and an attenuator 123 respectively, and quad-demodulated by the quad-demodulator 116 to retrieve the feedback bit streams ($I_f$ and $Q_f$). The $I_f$ and $Q_f$ signals are then input to subtracters $126_{I,Q}$ to be subtracted from the I and Q bit stream outputs from the encoder 110.

Figure 12:
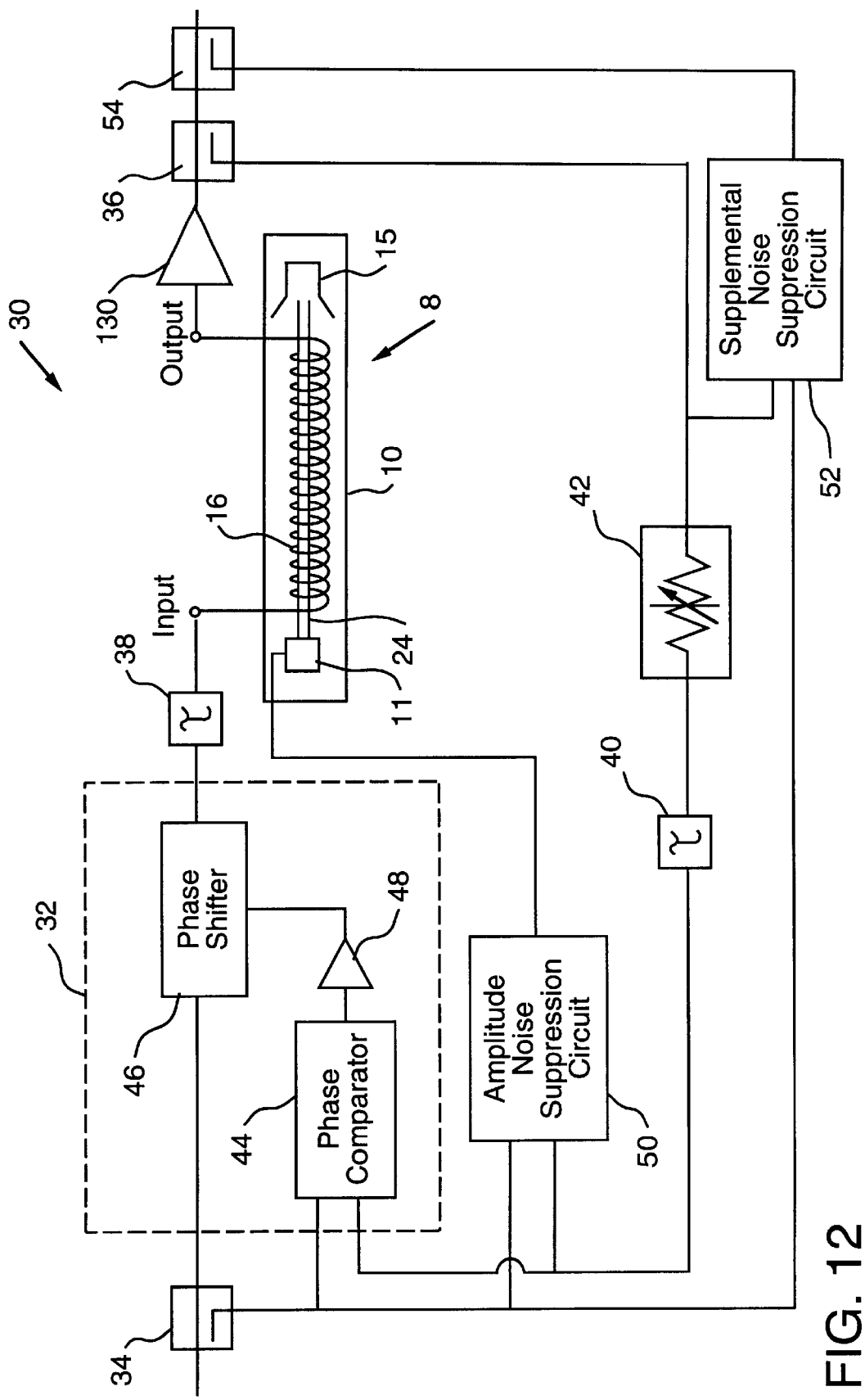

Benefits of the amplifier system 30 may also be realized in connection with suppressing noise for a system of cascaded amplifiers. FIG. 12 is a diagram of the amplifier system 30 according to such an embodiment. The amplifier system 30 in FIG. 12 includes a second amplifier 130, which is driven by the tube device 8. The second amplifier 130 may be, for example, a high power vacuum tube amplifier or solid-state amplifier. According to such an embodiment, the attenuation provided by the attenuator 42 and the coupler 36 may correspond to the gain provided by both of the tube device 8 and the second amplifier 130. As discussed hereinbefore with respect to FIGS. 5 and 6, the amplifier system 30 may be adaptive to compensate for variations in the gain provided by either the tube device 8 or the second amplifier 130. In addition, as discussed herein, the supplemental noise suppression circuit 52 may utilize, for example, a feedforward or feedback technique. The benefits of the amplifier system 30 may be extended to more than two cascaded amplifiers in a similar fashion. However, if the cumulative time delay introduced by each amplification stage is too great, the bandwidth may not be sufficient for the feedback control.

Although the present invention has been described with regard to certain embodiments thereof, those of ordinary skill in the art will recognize that many modifications and variations of the present invention may be implemented. For example, the amplitude noise suppression and phase noise suppression circuits described hereinbefore may be embodied in a single device, such as one DSP or ASIC. The foregoing description and the following claims are intended to cover all such modifications and variations.

What is claimed is:

1. An amplifier system, comprising:

a vacuum tube amplifier having an input signal terminal and an output signal terminal, wherein the vacuum tube amplifier is for amplifying an input signal supplied to the input signal terminal;
a phase comparator having a first input terminal responsive to the input signal and having a second input terminal coupled to the output signal terminal of the vacuum tube amplifier; and
a phase shifter having a first input terminal responsive to the input signal, a second input terminal coupled to an output terminal of the phase comparator, and an output terminal coupled to the input signal terminal of the vacuum tube amplifier.

2. The system of claim 1, wherein the phase shifter includes a wideband phase shifter.

3. The system of claim 1, further comprising an amplifier coupled between the output terminal of the phase comparator and the second input terminal of the phase shifter.

4. The system of claim 1, wherein the phase comparator is for detecting a phase difference between the input signal and an output signal of the vacuum tube amplifier.

5. The system of claim 4, wherein the phase shifter phase shifts the input signal by one hundred eighty degrees plus the phase difference detected by the phase comparator.

6. The system of claim 1, wherein the vacuum tube amplifier includes a traveling wave tube amplifier.

7. The system of claim 1, further comprising an amplitude noise suppression circuit having first and second input terminals and an output terminal, wherein the first input terminal is responsive to the input signal, the second input terminal is coupled to the output signal terminal of the vacuum tube amplifier, and the output terminal is coupled to an electron source of the vacuum tube amplifier.

8. The system of claim 7, wherein the output terminal of the amplitude noise suppression circuit is connected to one of a focusing electrode of the electron source and a grid of the electron source.

9. The amplifier system of claim 7, wherein the amplitude noise suppression circuit includes:
an amplitude comparator having first and second input terminals and an output terminal, wherein the first input terminal is responsive to the input signal and the second input terminal is coupled to the output signal terminal of the vacuum tube amplifier; and
a controller having an input terminal and an output terminal, wherein the input terminal is coupled to the output terminal of the amplitude comparator, and the output terminal is coupled to the electron source.

10. The amplifier system of claim 9, wherein the output terminal of the controller is coupled to the electron source via a transformer.

11. The amplifier system of claim 7, further comprising a supplemental noise suppression circuit having a first input terminal responsive to the input signal and a second input terminal coupled to the output signal terminal of the vacuum tube amplifier.

12. The amplifier system of claim 11, wherein the supplemental noise suppression circuit includes a circuit selected from the group consisting of a feedforward noise suppression circuit and a feedback noise suppression circuit.

13. The amplifier system of claim 1, further comprising a supplemental noise suppression circuit having a first input terminal responsive to the input signal and a second input terminal coupled to the output signal terminal of the vacuum tube amplifier.

14. The amplifier system of claim 13, wherein the supplemental noise suppression circuit includes a circuit selected from the group consisting of a feedforward noise suppression circuit and a feedback noise suppression circuit.

15. An amplifier system, comprising:
a vacuum tube amplifier having an input signal terminal and an output signal terminal, wherein the vacuum tube amplifier is for amplifying an input signal supplied to the input signal terminal; and
a phase noise suppression circuit responsive to an output signal of the vacuum tube amplifier for phase shifting the input signal supplied to the input signal terminal of the vacuum tube amplifier to compensate for phase noise introduced by the vacuum tube amplifier.

16. The system of claim 15, wherein the phase noise suppression circuit includes:
a phase comparator for comparing phases of the input signal and the output signal of the vacuum tube amplifier; and
a phase shifter coupled to the phase comparator for phase shifting the input signal based on a comparison of the phases of the input signal and the output signal.

17. The system of claim 15, further comprising an amplitude noise suppression circuit responsive to both the input signal and the output signal for controlling an amount of electrons emitted by an electron source of the vacuum tube amplifier.

18. The system of claim 17, further comprising a supplemental noise suppression circuit responsive to both the input signal and the output signal of the vacuum tube amplifier.

19. The system of claim 15, further comprising a supplemental noise suppression circuit responsive to both the input signal and the output signal of the vacuum tube amplifier.

20. An amplifier system, comprising:
a vacuum tube amplifier having an in, signal terminal and an output signal terminal, wherein the vacuum tube amplifier is for amplifying an input signal supplied to the input signal terminal; and
means for phase shifting the input signal supplied to the input signal terminal of the vacuum tube amplifier to compensate for phase noise introduced by the vacuum tube amplifier.

21. The system of claim 20, wherein the means for phase shifting include:
means for comparing phases of the input signal and an output signal of the vacuum tube amplifier; and
means for shifting a phase of the input signal based on a comparison of the phases of the input signal and the output signal.

22. The system of claim 20, further comprising means for controlling an amount of electrons emitted by an electron source of the vacuum tube amplifier to suppress amplitude noise introduced by the vacuum tube amplifier.

23. The system of claim 22, further comprising means for canceling noise distortion components at one of the input signal terminal and the output signal terminal of the vacuum tube amplifier.

24. The system of claim 20, further comprising means for canceling noise distortion components at one of an input signal terminal and the output signal terminal of the vacuum tube amplifier.

25. An amplifier system, comprising:
a vacuum tube amplifier having an input signal terminal and an output signal terminal, wherein the vacuum tube amplifier is for amplifying an input signal supplied to the input signal terminal;
a second amplifier having an input signal terminal and an output signal terminal, wherein the input signal terminal is coupled to the output signal terminal of the vacuum tube amplifier;

a phase comparator having a first input terminal responsive to the input signal and having a second input terminal coupled to the output signal terminal of the second amplifier; and a phase shifter having a first input terminal responsive to the input signal, a second input terminal coupled to an output terminal of the phase comparator, and an output terminal coupled to the input signal terminal of the vacuum tube amplifier.

26. The system of claim 25, further comprising an amplitude noise suppression circuit having first and second input terminals and an output terminal, wherein the first input terminal is responsive to the input signal, the second input terminal is coupled to the output terminal of the second amplifier, and the output terminal is coupled to an electron source of the vacuum tube amplifier.

27. The amplifier system of claim 26, further comprising a supplemental noise suppression circuit having a first input terminal responsive to the input signal and a second input terminal coupled to the output terminal of the second amplifier.

28. The amplifier system of claim 25, further comprising a supplemental noise suppression circuit having a first input terminal responsive to the input signal and a second input terminal coupled to the output terminal of the second amplifier.

29. A method for suppressing noise introduced by a vacuum tube amplifier, comprising:

detecting a phase difference between an input signal to the vacuum tube amplifier and an output signal from the vacuum tube amplifier indicative of phase noise introduced by the vacuum tube amplifier; and shifting a phase of the input signal based on the phase difference.

30. The method of claim 29, wherein shifting a phase includes shifting a phase of the input signal by one hundred eighty degrees plus the phase difference between the input signal and the output signal.

31. The method of claim 29, further comprising:

detecting an amplitude difference between an input signal to the vacuum tube amplifier and an output signal from the vacuum tube amplifier indicative of amplitude noise introduced by the vacuum tube amplifier; and adjusting an amount of electrons emitted by the electron source of the vacuum tube amplifier based on the amplitude difference between the input signal and the output signal.

* * * * *

UNITED STATES PATENT AND TRADEMARK OFFICE
CERTIFICATE OF CORRECTION

PATENT NO.    : 6,535,060 B2
DATED         : March 18, 2003
INVENTOR(S)   : Yehuda G. Goren et al.

It is certified that error appears in the above-identified patent and that said Letters Patent is hereby corrected as shown below:

Column 1,
Line 27, delete "especially" and substitute therefore with -- especially --

Column 3,
Line 63, delete "phasenoise" and substitute therefore with -- phase noise --

Column 10,
Line 31, delete "in," and substitute therefore with -- input --
Line 35, after "means," insert -- responsive to an output signal of the vacuum tube amplifier --
Line 42, delete "an" and substitute therefore with -- the --

Column 11,
Line 5, delete the period after "to"

Signed and Sealed this

Ninth Day of September, 2003

JAMES E. ROGAN
*Director of the United States Patent and Trademark Office*